United States Patent
Gross et al.

(10) Patent No.: US 8,563,084 B2
(45) Date of Patent: Oct. 22, 2013

(54) METHOD AND DEVICE FOR PRODUCING STOICHIOMETRY GRADIENTS AND LAYER SYSTEMS

(75) Inventors: Harald Gross, Langebrueck (DE); Carsten Deus, Dresden (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 507 days.

(21) Appl. No.: 12/862,290

(22) Filed: Aug. 24, 2010

(65) Prior Publication Data

US 2011/0052796 A1 Mar. 3, 2011

(30) Foreign Application Priority Data

Aug. 25, 2009 (DE) .................. 10 2009 038 519

(51) Int. Cl.
C23C 14/24 (2006.01)
(52) U.S. Cl.
USPC .............. 427/248.1; 427/255.24; 427/255.5
(58) Field of Classification Search
USPC ................ 427/248.1, 255.24, 255.5
See application file for complete search history.

(56) References Cited

U.S. PATENT DOCUMENTS

| | | | |
|---|---|---|---|
| 5,460,853 A * | 10/1995 | Hintz et al. | 427/255.5 |
| 6,488,824 B1 | 12/2002 | Hollars et al. | |
| 6,632,285 B2 | 10/2003 | Wang et al. | |
| 2004/0011288 A1* | 1/2004 | Affinito | 118/718 |
| 2005/0008778 A1* | 1/2005 | Utsugi et al. | 427/248.1 |
| 2005/0072361 A1* | 4/2005 | Yang et al. | 118/726 |
| 2007/0087130 A1* | 4/2007 | Arai | 427/457 |
| 2007/0218201 A1* | 9/2007 | Gottsman et al. | 427/248.1 |
| 2009/0025885 A1* | 1/2009 | Buschbeck et al. | 159/31 |
| 2011/0315095 A1* | 12/2011 | Bruckner et al. | 122/7 R |

FOREIGN PATENT DOCUMENTS

| | | |
|---|---|---|
| DE | 19845268 C1 | 1/2000 |
| DE | 10312646 A1 | 10/2004 |
| DE | 102004014323 A1 | 10/2005 |
| EP | 2204467 A1 | 7/2010 |
| JP | 2003301255 A | 10/2003 |
| JP | 2007-146219 | * 6/2007 |
| JP | 2009-41040 | * 2/2009 |

* cited by examiner

Primary Examiner — Bret Chen
(74) Attorney, Agent, or Firm — Heslin Rothenberg Farley & Mesiti P.C.

(57) ABSTRACT

A process and a device for coating substrates with a stoichiometric gradient in an in-line coating system include at least two evaporation devices, each with an evaporator tube. The evaporator tubes are implemented so as to be tiltable independently of one another, whereby the transition area of the two vapor lobes can be adapted to the requirements of the gradient profile. Furthermore, the spacing of the evaporator tubes from the substrate and each other can be set.

9 Claims, 3 Drawing Sheets

METHOD AND DEVICE FOR PRODUCING STOICHIOMETRY GRADIENTS AND LAYER SYSTEMS

CROSS REFERENCE TO RELATED APPLICATIONS

Figure 1:
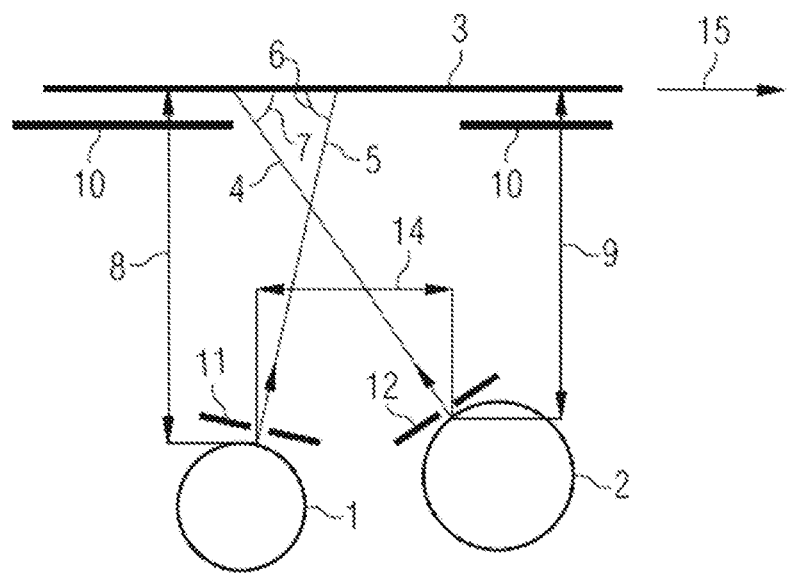

This application claims priority of German application No. 10 2009 038 519.3-45 filed on Aug. 25, 2009, the entire disclosure of these applications being hereby incorporated herein by reference.

BACKGROUND ART

The invention relates to a process and a device for coating substrates in an in-line coating system comprising at least two evaporation devices, each with an evaporator tube.

In the mass production of organic semiconductors from so-called "small molecules" for use in illuminants, in monitors, in photovoltaics, in electronics, or in other products the carbon evaporation of two or more organic materials is of great importance.

This applies in particular to the emission layers of OLEDs (Organic Light Emitting Diodes) and to the absorber layers of OSCs (Organic Solar Cells) as well as to the doped charge transport layers which can also often serve for the injection of charge carriers.

In many cases a constant stoichiometry of two or more organic materials within one layer of a multi-layer component is desired. On the other hand, there are cases in which 100% of one material is to be deposited on one boundary surface and, for example, only 10%, or even only 0%, is to be deposited on the other boundary surface. A whole array of factors, such as optimal charge carrier injection (100% portion), good charge transport (10%), or chemical incompatibility with the material of the adjacent layer (0%), can play a role here.

The next-to-last case is in general achieved by first only one material being deposited for a first layer (100% portion) and subsequently a carbon evaporation of the same material (10% portion) in combination with a second material (90% portion) being carried out for a second layer.

The abrupt transition of the stoichiometry between the first and second layer or the different morphology of the respective layer can possibly be unfavorable for the function of the component. Thus in these cases a third layer is deposited between the first and second layers, which has a stoichiometry corresponding, for example, to the average value of the stoichiometric ratios of the first and second layers.

In the manufacture of the components in a cluster system only two vapor sources are required for the three layers, said vapor sources being switched on and off in a temporal sequence. In production systems, on the contrary, reasons of cost demand greater throughput, which can in principle be achieved with in-line or roll-to-roll systems. The consequence is however that for the latter two types of systems a total of five vapor sources are required (three for material 1 and two for material 2) and thus the complexity, or the costs, of the system are increased.

Going beyond the three-layer system it would possibly be desirable to attain a gradual transition of the stoichiometry or morphology instead of a stepwise transition.

Moreover, it would also be of interest in an in-line or roll-to-roll system to keep the stoichiometry in a layer as constant as possible.

From the state of the art various possibilities for producing gradient layers on substrates are known.

Thus, DE 10 2004 014 323B4 discloses a process for producing a gradient layer or layer sequence on a substrate. Therein the deposition of at least two materials within one coating compartment is accomplished by sputtering with two magnetron cathodes, each of which carries a target. In so doing, a mixed layer arises in the transition area from the first to the second target. Furthermore, baffles are provided which, independently of one another, permit a shielding of the target with respect to the substrate.

A similar development is disclosed by U.S. Pat. No. 6,488,824 B1, in which two magnetron cathodes are also disposed which, by means of shielding, make possible a transition area of the two targets. In this way a constant mixed layer can be deposited.

The disadvantage of using sputtering systems for producing gradient layers preferably of organic materials lies in the fact that they are usually destroyed by the sputtering process, on account of which sputtering is not suitable as a method of deposition of organic materials.

Consequently, for organic materials, an evaporation is carried out in a crucible. Typical state-of-the-art vapor sources of in-line systems or roll-to-roll systems are tubes in which vapor exiting from a crucible is uniformly distributed. The tubes comprise a plurality of nozzles which are disposed in a row transverse to the direction of advance of the substrate. In the carbon evaporation of two (organic) materials, two tubes, one for each of the respective materials, customarily emit vapor through their nozzles onto the substrate.

DE 103 12 646 A1 discloses a process for producing a converter layer, where in that process an organic converter material is mixed into an inorganic matrix. This is achieved by intersecting vapor deposition of the two materials. These are heated and evaporated in two different vapor deposition devices, where the resulting vapor lobes intersect and form a common vapor deposition zone. For a continuous vapor deposition the two vapor deposition devices have a fixed orientation relative to one another.

The mixed layer thus achieved has a uniform structure and under no circumstances permits a flexible change of the gradient profile.

BRIEF SUMMARY OF INVENTION

The invention is thus based on the object of specifying a process and a device which make possible a gradual variation of the stoichiometry within a layer with a minimum number of vapor sources or as constant a stoichiometry as possible in a layer with maximum utilization of the vapor.

According to the invention at least two evaporation devices are provided for coating substrates in an in-line vacuum coating system, where each evaporation device comprises an evaporator tube. In the first evaporation device a first material is heated and evaporated while in a second evaporation device a second material is heated and evaporated. The evaporated materials are subsequently introduced into the vacuum coating system via the evaporator tubes, each aligned with a vapor inlet device, where the evaporated materials form vapor lobes corresponding to the geometry of the openings in the evaporator tubes. The angle of the evaporator tubes to the substrate can be adjusted in this way, whereby the positioning of the vapor lobes in relation to the substrate can be varied. Thereby the vapor lobes can be positioned with respect to one another on the substrate so that a mixing of the materials in the overlapping areas of the vapor lobes results and as a consequence of this, a deposition of a mixed layer of the two evaporated materials results. In the carbon evaporation of two (organic) materials, two tubes, one for each material, customarily emit vapor through their nozzles onto the substrate.

In one embodiment of the invention the angle of the vapor entry direction to the substrate is set in the range of +90°<x<−90°, where the angles of the individual evaporator tubes are set independently of one another.

In a further embodiment of the invention the spacing of the evaporator tubes from the substrate is set. Thereby the width of the vapor lobe can be set to produce a desired gradient of the evaporated material in the mixed layer.

In a further embodiment of the invention the spacing of the evaporator tubes is adjusted during the coating process. This is advantageous in particular if, when the process parameters are known, the changes in the form of the gradient which are due to the spacing of the evaporator tubes can be used for optimizing the mixed layer.

In a further embodiment of the invention the spacing of the evaporator tubes from one another is set. In this way the positions of the vapor lobes on the substrate can be changed. Furthermore, the percentage of the overlapping areas of the two vapor lobes can be set thereby, whereby an altered mixing of the two evaporated materials within the overlapping area occurs and thus a change of the form of the gradient in the mixed layer.

In a further embodiment of the invention the spacing of the evaporator tubes from one another is adjusted during the coating process. In this way there can be an optimization of the form of the gradient in the on-going process by changing the percentages of the evaporated materials in the overlapping area.

In a further embodiment of the invention a gradient of the first and second material is produced in the mixed layer, where the profile of the gradient within the mixed layer can be adjusted by changing the spacing of the evaporator tubes from the substrate as well as from one another and by changing the angle of the perpendicular bisectors of the evaporator tubes to the substrate.

In a further embodiment of the invention the vapor entering the vacuum coating system has the form of a vapor lobe, where the form of the vapor lobes of the evaporated materials is set by baffles which are disposed in front of the openings in the evaporator tubes. The form of the vapor lobe can be changed by the baffles in front of the openings. According to the geometry of the baffle there is thus a capability of adapting the form of the vapor lobe to the desired form of the gradient.

In a further embodiment of the invention organic materials are used as materials to be evaporated. Through the use of two organic materials, organic mixed layers, e.g. for use in organic, photoactive components, such as organic solar cells or OLEDs, can be produced. In particular doped layers can be produced, where one of the two organic materials to be evaporated forms the dopant and the other material forms the acceptor of the mixed layer.

In an extension of that embodiment it is possible to produce gradients of the dopant in the mixed layer which are in accordance with the invention, where the gradient profile can be adapted by setting the angles of the direction of entry of the vapor, the spacing of the evaporator tubes from the substrate, and the spacing of the evaporator tubes from one another.

In a further embodiment of the invention so-called small molecules are preferably evaporated. Small molecules in the sense of the present invention are understood to mean non-polymeric organic molecules with monodisperse molar masses between 100 and 2,000, which are solid under normal pressure (atmospheric pressure of the ambient atmosphere) and at room temperature. In particular these small molecules are also photoactive, where photoactive is understood to mean that the molecules change their electric charge when exposed to light.

In a further embodiment of the invention the organic materials used are at least partially polymers.

In a further embodiment of the invention a device which is in accordance with the invention for coating substrates in an in-line vacuum coating system comprises at least two evaporation devices for heating and evaporating the materials to be deposited, each with an evaporator tube, where openings are disposed in the evaporator tubes for introducing the evaporated materials into the vacuum coating system. Therein the spacing of the evaporator tubes from the substrate and the angle of the direction of entry of the vapor to the substrate are implemented so that they can be adjusted independently of one another.

In a further embodiment of the invention the angle of the direction of entry of the vapor to the substrate is implemented so as to be adjustable in the range of +90°<x<−90°. In this way the angles of the directions of entry of the vapor can be adjusted in accordance with the requirements of the desired gradient profile.

In a further embodiment of the invention the openings in the evaporator tubes are implemented as nozzles.

In a further embodiment of the invention the openings in the evaporator tubes are implemented as slots.

In a further embodiment of the invention baffles are disposed in front of the openings in the evaporator tubes in the direction towards the substrate. These baffles permit an adaptation of the form of the vapor lobes, perhaps in the form of an adaptation of the vapor lobes to the requirements of the desired gradient profile.

In a further embodiment of the invention baffles are disposed in front of the substrate. In this way only a part of the substrate of the coating is accessible by the materials to be evaporated, whereby one avoids any undesired deposition of evaporated materials outside of the substrate's area subject to vapor deposition.

In a further embodiment of the invention the baffles are implemented in such a manner that they can be heated. This is advantageous in particular in order to prevent any deposition of the evaporated materials on the baffles.

BRIEF DESCRIPTION OF DRAWING FIGURES

Figure 2:
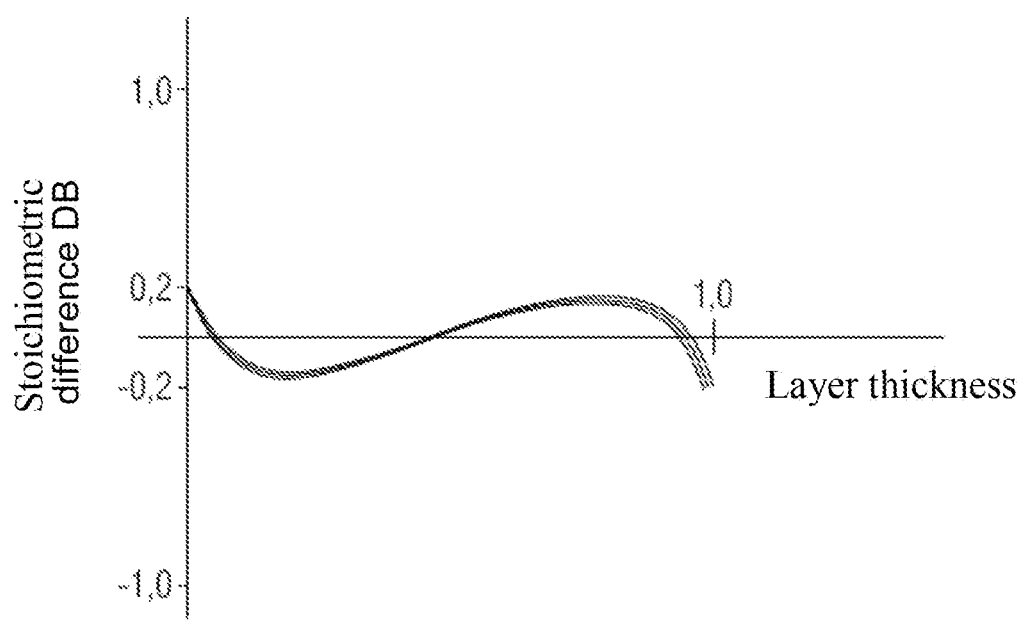
Figure 3:
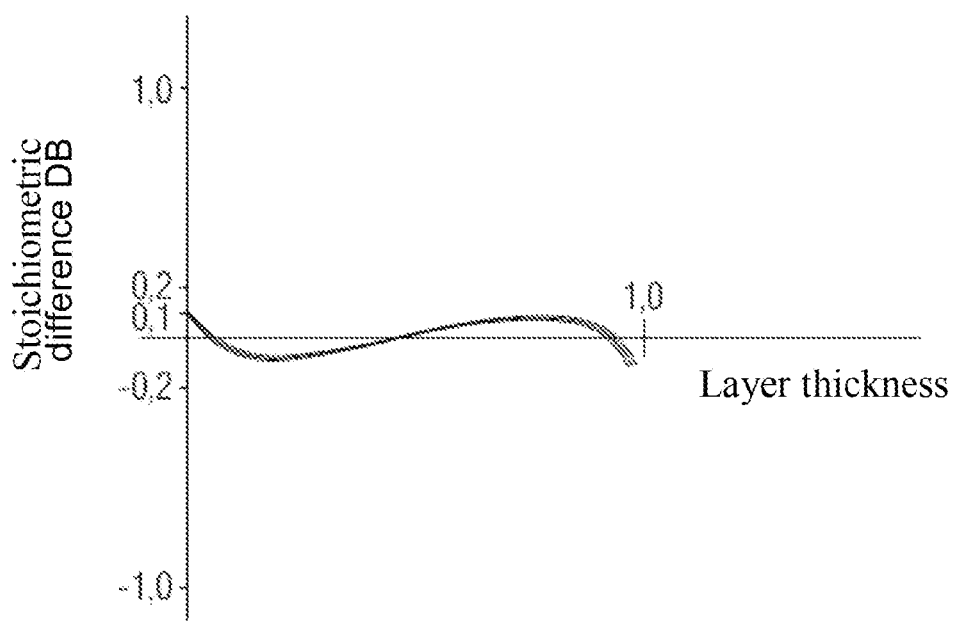
Figure 4:
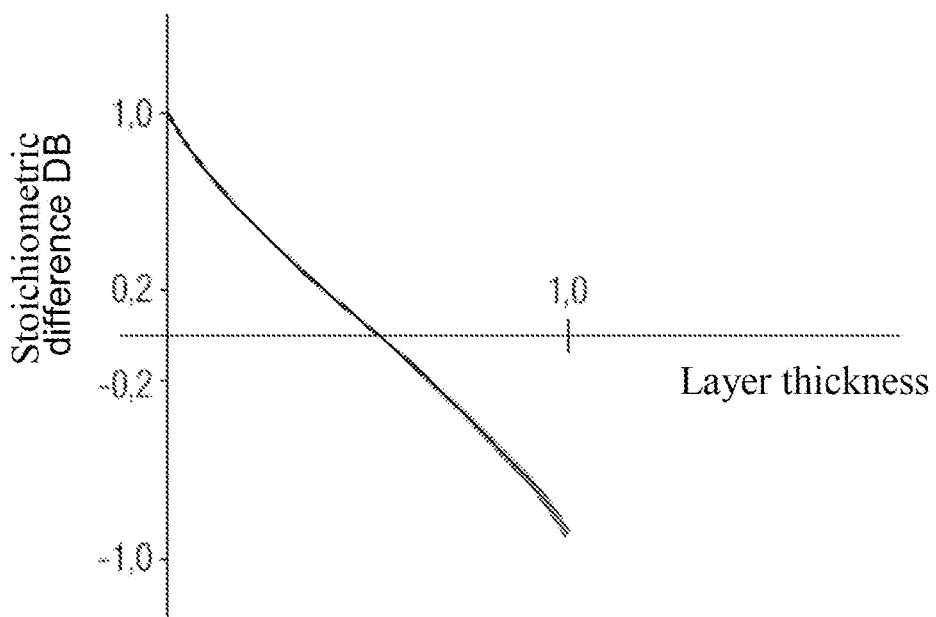
Figure 5:
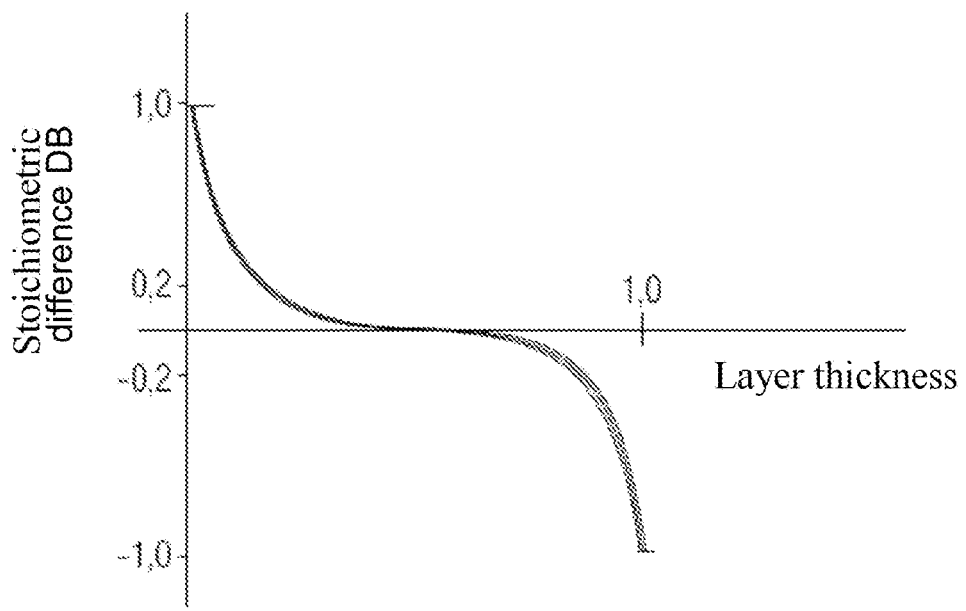

Additional features and advantages of the invention are to be inferred from the following detailed description of embodiment examples as well as the attached drawings. In them:

FIG. 1 shows a schematic representation of a conceptual arrangement for a carbon evaporation in an in-line coating system or a roll-to-roll coating system, FIG. 2 shows a graph of a Monte-Carlo simulation of the stoichiometric difference relative to the layer thickness for a standard setting of the evaporator tubes with equal emission rates of their vapor streams, symmetric geometry, no nozzle baffles, and a large, centered substrate baffle opening, FIG. 3 shows a graph of a Monte-Carlo simulation of the stoichiometric difference relative to the layer thickness in changing the angle of nozzles and substrate as well as the spacing between the evaporator tubes, FIG. 4 shows a graph of a Monte-Carlo simulation of the transition of a material from a boundary surface with 100% to another boundary surface with 0%, and FIG. 5 shows a graph of a Monte-Carlo simulation of the transition of a material between the boundary surfaces which has as equal as possible a percentage of the two materials over the entire layer thickness.

Figure 6:
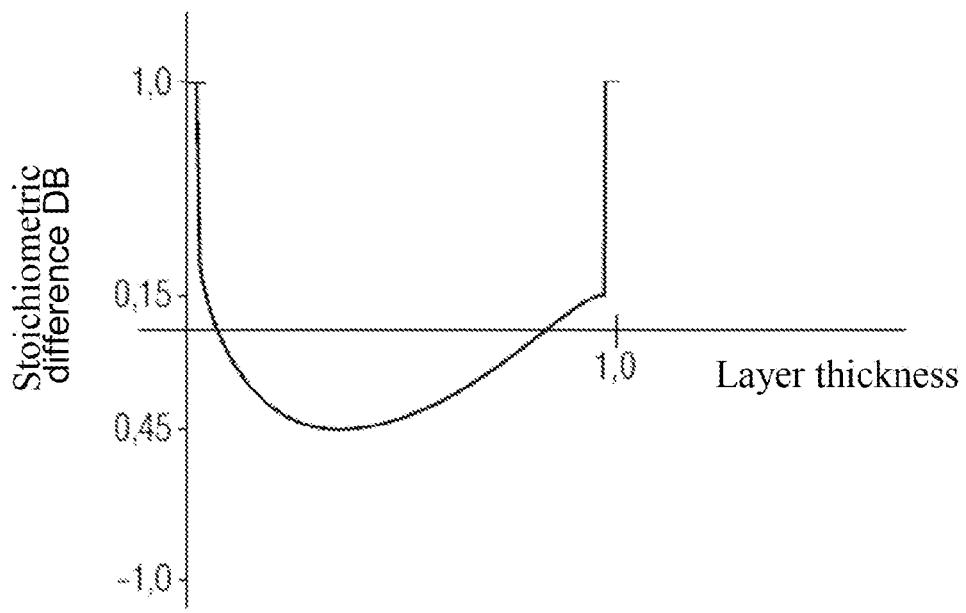

FIG. 6 shows a graph of a Monte-Carlo simulation of the transition of a material from a boundary surface with 100% to another boundary surface with 100%. The second material is located exclusively in the middle of the layer.

DETAILED DESCRIPTION

FIG. 1 shows the schematic arrangement for a carbon evaporation in an in-line coating system. A first organic material is heated and evaporated in a first evaporation device. The vapor is introduced into the in-line coating system via the evaporator tube 1 of the first evaporator device. In so doing, the vapor has a vapor entry direction 4. The vapor entry direction 4 is dependent on the geometry of the openings in the evaporator tubes which can be implemented as a slot or nozzles and on the angle of the openings relative to the substrate 3. In a second evaporator device a second material is heated and evaporated, where the vapor is introduced into the in-line coating system via the second evaporator tube 2. The resulting vapor entry direction 5 of the second evaporation device, as in the case of the vapor entry direction 4, is dependent on the geometry of the openings in the evaporator tube 2 and on the angle of the openings. The evaporator tubes 1,2 extend perpendicularly to the plane of the page and are somewhat longer than the substrate 3 is wide.

In connection with this, significant factors for the form of the gradient are the resulting angles 6,7 of the vapor coming from the first and second evaporation devices and entering into the in-line coating system. Depending on the setting of the two angles 6,7 a different transition area 13 results, in which a mixing of the first and second material takes place and as a consequence of this a mixed layer in the form of a gradient is deposited on the substrate 3. The two angles 6,7 can be set independently of one another.

When the spacing 14 between the first and second evaporator 1,2 is changed, there is a change of the transition area 13 and, resulting from this, a change of the form of the gradient.

An additional capability for change results from changing the spacings of the two evaporator tubes 1,2 from the substrate 3. In so doing, the spacing 8 of the first evaporator tube 1 from the substrate 3 and the spacing 9 of the second evaporator tube 2 can be set independently of one another. Changes of the gradient profile also result from these capabilities for change.

With a suitable choice of the angles 6,7 of the openings of the evaporator tubes 1,2 to the substrate 3, of the spacing 14 between the first and second evaporator tube 1, 2, and the spacings 8,9 of the evaporator tubes 1,2 from the substrate a definite stoichiometry can be set.

Furthermore, baffles 11,12 which are located either directly in front of the evaporator tubes 1,2 or baffles 10 which are located directly in front of the substrate 3 can affect the stoichiometry. However, corresponding baffles 10,11,12 are always associated with a reduction of the material yield and should only be taken into consideration as a last option or for fine adjustments. With the baffles 11,12 described above the vapor lobe can be focused, which provides an additional capability for adaptation to the requirements of a stoichiometric gradient.

As has already been mentioned in the introduction, the size of the opening of the substrate baffle 10 in the direction of advance of the substrate 15 as well as its position relative to the evaporator tubes 1,2 plays a role in the stoichiometry. Similar remarks apply for the baffles 11,12 which are disposed in front of the openings of the evaporator tubes 1,2, where these can be set independently of one another.

The following graphs shown in FIG. 2 to FIG. 6 are exemplary results which have been obtained with the aid of Monte-Carlo simulations in combination with geometric considerations. In all the graphs the stoichiometric difference DB= (N2−N1)/(N2+N1) with the number of particles N1 of material 1 and number of particles N2 of material 2 is plotted over the layer thickness, which ranges from 0 to 1.

In FIG. 2 the result of a standard setting of the evaporator tubes 1,2 for equal emission rate of the vapor streams, symmetric geometry (A1=A2; a=b), no baffles 11,12 in front of the evaporator tubes 1,2, and a large, centered substrate baffle opening is represented. The standard setting is characterized by the fact that the perpendicular bisectors of the openings of the two evaporator tubes 1,2 meet at a line of the substrate 3. Equal emission rate means that both materials are emitted in equal amounts and in the ideal case the ratio of the materials deposited on the substrate 3 remains constant. Due to the vapor lobes formed by the openings of the evaporator tubes 1,2, the geometries occurring in practice, and the forward movement of the substrate 3 relative to the evaporator tubes 1,2, the stoichiometry of the deposited materials varies significantly. In the case shown the variation of DB is ±20%.

If one wishes to reduce the tolerance of DB, that is, to keep the stoichiometry of the materials as constant as possible, then this can happen by reducing the spacing 14 between the evaporator tubes 1,2 as well as changing the tilt angle 6,7 of the evaporator tubes 1,2 (in case of equal tilt angles), as can be seen in FIG. 3. Therein the variation of DB falls to ±10%, therefore to half of that with the standard parameters.

Similar remarks apply for emission rates chosen differently in order to maintain a ratio of materials which is different from 1.

If the goal is to obtain 100% of the one material on one boundary surface and 0% of the same material on the other, and between them a continuous and linear decrease of the concentration, then this can once again be accomplished by a suitable selection of the geometric parameters, therefore via the tilt angles 6 and 7 as well as the spacings 8,9 and 14. An example of this can be seen in FIG. 4.

In comparison to the previous example, in practice a decrease from 100% on the one boundary surface to a minimum of 10% on the other boundary surface is more likely to be required. This an be achieved relatively simply by a substrate baffle 10 on one side, for example, by shifting the right baffle in FIG. 1 to the left so that the curve shown in FIG. 4 is cut off a little at the right edge, i.e. DB can never reach −1.0. Alternatively to this, the spacing 9 can be increased and thus the material yield can be improved in comparison to the shifting of the baffle 10.

Optionally for FIG. 4 it is possible to set the concentration of 100% on one boundary surface, 0% on the other boundary surface, and to set the intermediate area with as constant as possible, in this case equal, percentage of the materials (see FIG. 5).

A further important case is represented in FIG. 6. In it a material, e. g. light-absorbing or light-emitting molecules, are present exclusively in the center of the layer. Only the second material, e.g. charge-transporting molecules, has at its boundary surface any contact with adjacent layers. This layer structure can prevent an unintentional charge carrier combination which would result in case of direct contact with light-absorbing or light-emitting molecules of adjacent layers.

The invention claimed is:

1. Process for coating substrates in a continuous flow vacuum coating system with at least two evaporation devices, each device having a respective evaporator tube, comprising:
   in a first evaporation device, heating and evaporating a first material,
   in a second evaporation device, heating and evaporating a second material,
   introducing evaporated material from each evaporation device into the vacuum coating system via the respective evaporator tube in a vapor entry direction, and producing a mixed single layer of evaporated material from the at least two evaporation devices on a substrate, and
   independently adjusting angle of the vapor entry direction of at least one evaporated tube to the substrate, and setting spacing from the substrate of at least one evaporator tube to produce a desired gradient of the evaporated material in the mixed single layer.

2. Process according to claim 1, wherein the angle of the vapor entry direction to the substrate is set in the range of $+90° < x < -90°$, and the angle of vapor entry direction for individual evaporator tubes is set independently of other evaporator tubes.

3. Process according to claim 2, further comprising producing a gradient of the first material and second material in a mixed layer on the substrate, and setting a profile of the gradient in the mixed layer by controlling spacing of the evaporator tubes from the substrate, spacing of respective evaporator tubes from one another, and the angle of the vapor entry direction to the substrate.

4. Process according to claim 1, wherein the spacing of the evaporator tubes from the substrate is adjusted during the coating process.

5. Process according to claim 1, further comprising setting spacing of the evaporator tubes from one another to vary a gradient of the evaporation material in the mixed single layer.

6. Process according to claim 5, wherein the spacing of the evaporator tubes from one another is adjusted during the coating process.

7. Process according to claim 1, wherein vapor enters into the vacuum coating system as a vapor lobe, and further comprising setting form of a vapor lobe of the evaporated materials with a baffle disposed in front of an opening in a respective evaporator tube.

8. Process according to claim 1, wherein at least one of the first material and the second material comprises an organic material.

9. Process according to claim 1, wherein the first material is different from the second material.

* * * * *